Aug. 27, 1968 W. E. SODTKE 3,399,354
TRANSFORMERLESS PUSH-PULL TRANSISTOR
AMPLIFIER WITH FEEDBACK
Filed May 14, 1965

Inventor:
Wolfgang Södtke

United States Patent Office 3,399,354
Patented Aug. 27, 1968

3,399,354
TRANSFORMERLESS PUSH-PULL TRANSISTOR AMPLIFIER WITH FEEDBACK

Wolfgang E. Sodtke, Berlin, Germany, assignor to Loewe Opta G.m.b.H., Berlin, Germany Filed May 14, 1965, Ser. No. 456,007
Claims priority, application Germany, July 11, 1964, L 48,253
5 Claims. (Cl. 330—13)

ABSTRACT OF THE DISCLOSURE

In a push-pull transistor amplifier arrangement without transformer coupling consisting of a plurality of transistor stages connected in cascade, a feedback circuit is used in the transistor amplifier stage subsequent to the first transistor stage operating as driver transistor thus enabling the latter transistor to operate with a high interior resistance which is necessary to assure a nearly linear modulation. As feedback stage there may be used a separate transistor or one transistor of the phase-inverter stage subsequent to said driver transistor stage.

The invention relates to a push-pull transistor amplifier arrangement without transformers, more particularly for low-frequency power amplifiers such as e.g. are used for high quality radio broadcasting installations, and aims at reducing and/or eliminating the distortions of current transfer occurring in class-B push-pull output stages. This means distortions which occur in the region of the AC zero crossover when the two push-pull branches are switched over.

Push-pull transistor amplifier arrangements without transformers for radio broadcasting purposes are known which consist of a phase-inverter stage equipped with complementary transistors of an output stage with a pair of identical transistors or complementary transistors and of an input driver stage of high voltage amplification.

This invention relates to an improvement of such arrangements with regard to the control of the transistors of the phase-inverter stage. In the known arrangements it is usual to have a voltage control between the driver and phase-inverter stages. Because of the sharply curved control characteristic (collector current $I_C$ as a function of the base-emitter voltage $U_{BE}$) of the transistors in the phase-inverter and output stages during class-B operation, the output current ($I_C$) is distorted and difficulties arise with the necessary overlapping of the two characteristic limbs of the transistors in push-pull operation in the region of small base-emitter voltages. One of these difficulties is the setting of a definite base-emitter bias in the state of quiescence and temperature compensation of the quiescent current.

In contrast to this, when there is current-control of the phase-inverter stage the practically linear control characteristic (collector current $I_C$ as a function of the base current $I_B$) is effective, so that in the region of the zero point of the two characteristics for the two pushpull branches modulation is almost linear. A necessary factor for this is that the internal resistance of the driver stage controlling the phase-inverter stage is very great. In accordance with the invention this can be achieved in a simple manner by a feedback stage in emitter follower arrangement connected after the driver stage and working in class-A operation, the output voltage of which circuit is fed back over a capacitor to a tapping in the collector resistance of the driver stage.

For this feedback stage (a) a separate transistor or also (b) one of the two phase-inverter transistors, which must work in class-A operation here, can be used.

The arrangement according to the invention greatly reduces the non-linear harmonic distortion factor of the output stage and ensures very good temperature stability.

Further details of the invention are explained in the exemplary designs shown in the drawings.

Figure 1:
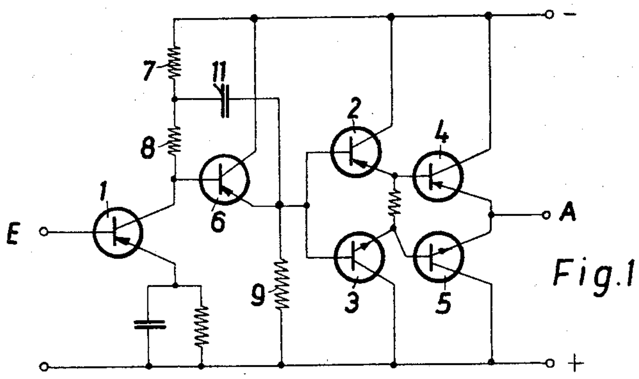
FIG. 1 shows a push-pull amplifier arrangement without transformers, in which an additional transistor is used for the feedback circuit between driver stage and phase-inverter stage.

Referring to FIG. 1 the arrangement in accordance with the invention consists of a driver stage with a pnp transistor 1 and a subsequent phase inverter stage with a pair of complementary transistors (pnp, npn) 2 and 3 in class-B push-pull arrangement and connected thereto an output stage with two complementary power transistors 4 and 5 in push-pull connection. For this last stage a circuit with identical transistors can be used instead of complementary transistors. In this the invention consists in the fact that between driver stage 1 and phase-inverter stage 2, 3 a feedback transistor stage 6 working in class-A operation is interposed, from whose output resistance (emitter resistance) 9 the output voltage is fed back over condenser 11 to the tapping point of the driver stage collector resistance which is divided into resistances 7 and 8. This feedback causes a dynamically high internal resistance in driver stage 1, as is needed for the above described current control. The input voltage is applied at E and the output voltage picked up at A.

Figure 2:
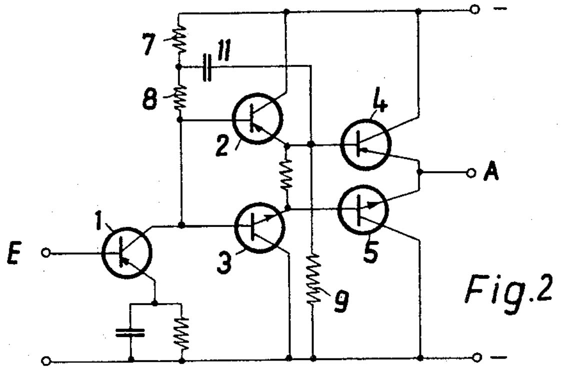
FIG. 2 shows a further example of design in which the one transistor of the phase-inverter stage is at the same time also utilized for the feedback.

FIG. 2 shows a similarly arranged circuit merely with the difference that instead of the special transistor stage 6 the upper transistor 2 of the phase inverter stage is at the same time formed as a feedback stage. Unlike FIG. 1 it also saves an additional transistor stage. For the corresponding elements in this arrangement the same numbering has been given as in FIG. 1. Naturally transistor 3 can be used here as a feedback stage as it also could in the later example shown in FIG. 3.

Figure 3:
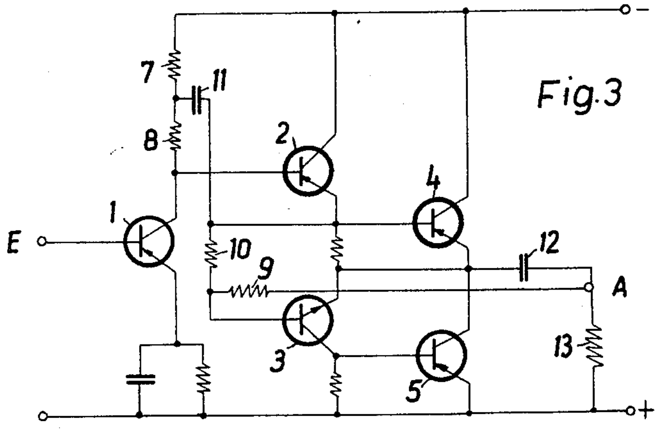
FIG. 3 shows a further modification of the circuit in accordance with FIG. 2.

FIG. 3 shows a further exemplary design for the push-pull transistor amplifier arrangement without transformers. Here just as in FIG. 2 the one transistor 2 of the phase-inverter stage is used for the feedback in accordance with the invention. No. 9 is again the emitter resistance of the feedback transistor 2, which here is connected to the junction point of isolating capacitor 12 and load resistance 13 of the output stage consisting of transistors 4 and 5. This connection at point A allows a greater voltage modulation range of the feedback transistor 2 than the connection to the positive pole used in FIG. 2.

By means of resistance 10 an additional bias for the phase inverter stage 2, 3 can be produced, which can compensate for residual distortions of current transfer.

The output stage with transistors 4 and 5 uses here e.g. identical transistors, in place of which, however, complementary transistors can also be used.

To summarize: it is repeated that the advantage of the arrangement in accordance with the invention is to be seen in the avoidance of the difficulties of an exact output-stage quiescent current adjustment and the then necessary temperature compensation of the output-stage quiescent current such as occur in the known arrangements, without additional expenditure of circuit elements. The elimination of the temperature compensation, which in the invention is not absolutely necessary, even makes it possible to obtain higher efficiency of the output-stage transistors. With the invention there is a great reduction in the non-linear harmonic distortion factor of the output-stage and very good temperature compensation.

What is claimed is:

1. A push-pull transistor amplifier arrangement without transformers for power amplifiers comprising a driver transistor stage, a phase-inverter stage including a pair of transistors conected in push-pull, an output transistor stage having a pair of transistors connected in push-pull too, one transistor of said phase-inverter stage being connected as feedback stage, the output voltage of which is fed back via a capacitor to a tap of the collector resistance of said driver transistor stage.

2. A push-pull transistor amplifier arrangement without transformers for power amplifiers comprising a driver transistor stage, a subsequent transistor stage, a phase-inverter stage including a pair of transistors connected in push-pull, and an output transistor stage having a pair of transistors connected in push-pull too, said stages being connected in cascade, said transistor stage subsequent to said driver transistor stage being connected as feedback stage, the output voltage of which is fed back via a capacitor to a tap of the collector resistance of said driver stage.

3. A push-pull transistor amplifier arrangement as claimed in claim 2, wherein said transistor stage connected as feedback amplifier is working in class A operation and the transistors of said phase-inverter stage are working in class B operation.

4. A push-pull transistor amplifier arrangement as claimed in claim 2, wherein said transistor stage operating as feedback amplifier is connected with its base electrode to the collector electrode of said driver transistor stage and with its emitter electrode to the base electrodes of said subsequent phase-inverter stage, said base electrodes of the latter being directly connected to each other, while the feedback capacitor is located between said tap of the collector resistance of said driver transistor stage and the emitter electrode of said feedback transistor stage.

5. A push-pull transistor amplifier arrangement without transformers for power amplifiers comprising a driver transistor stage, a phase-inverter stage including a pair of transistors connected in push-pull, an output transistor stage having a pair of transistors connected in push-pull too, and an isolating capacitor in said output transistor stage, one transistor of said phase-inverter stage being connected as feedback stage, the output voltage of which is fed back via a capacitor to a tap of the collector resistance of said driver transistor stage, said isolating capacitor being connected between the load resistance of said output transistor stage and the emitter of one transistor of said latter stage, the emitter resistance of the feedback transistor stage being connected with its terminal remote from the emitter to the junction point of said isolating capacitor and the load resistance of said output transistor stage, the connection point of said isolating capacitor with the emitter electrode of said one output transistor being simultaneously connected to the emitter electrodes of the transistors of said phase-inverter stage.

No references cited.

ROY LAKE, *Primary Examiner.*

E. C. FOLSOM, *Assistant Examiner.*